United States Patent [19]
Ando et al.

[11] Patent Number: 5,264,286
[45] Date of Patent: Nov. 23, 1993

[54] LAMINATED GLASS STRUCTURE

[75] Inventors: Eiichi Ando; Yasuo Hayashi; Koichi Osada; Akira Hirano, all of Yokohama; Junichi Ebisawa, Tokyo, all of Japan

[73] Assignee: Asahi Glass Company Ltd., Tokyo, Japan

[21] Appl. No.: 819,594

[22] Filed: Jan. 9, 1992

Related U.S. Application Data

[63] Continuation of Ser. No. 451,311, Dec. 15, 1989, abandoned, which is a continuation-in-part of Ser. No. 318,330, Mar. 3, 1989, Pat. No. 5,110,637.

[30] Foreign Application Priority Data

| Mar. 3, 1988 | [JP] | Japan | 63-48765 |
| Mar. 31, 1988 | [JP] | Japan | 63-76202 |
| Jun. 14, 1988 | [JP] | Japan | 63-144827 |
| Oct. 21, 1988 | [JP] | Japan | 63-264163 |
| Dec. 21, 1988 | [JP] | Japan | 63-322736 |
| Jun. 29, 1989 | [JP] | Japan | 64-165414 |
| Aug. 1, 1989 | [JP] | Japan | 64-197993 |

[51] Int. Cl.$^5$ .................................... B32B 15/00
[52] U.S. Cl. ................................ 428/432; 428/212; 428/418; 428/426; 428/433; 428/446; 428/450; 428/451; 428/457; 428/461; 428/469; 428/689; 428/697; 428/698; 428/699; 428/701; 428/702; 428/704
[58] Field of Search ............. 428/418, 426, 427, 432, 428/446, 469, 472, 689, 697, 702, 704, 212, 908.8, 433, 450, 451, 457, 461, 469, 698, 699, 701, 913; 427/126.8, 419.1, 419.2

[56] References Cited

U.S. PATENT DOCUMENTS

| 3,894,244 | 11/1974 | Groth | 156/199 |
| 3,922,471 | 11/1975 | Ellis | 428/432 |
| 4,187,336 | 2/1980 | Gordon | 428/432 |
| 4,386,130 | 5/1983 | Hayashi et al. | 428/216 |
| 4,556,599 | 12/1985 | Sato | 428/216 |
| 4,590,118 | 5/1986 | Yatabe | 428/215 |

FOREIGN PATENT DOCUMENTS

| 177672 | 4/1983 | European Pat. Off. |
| 0281894 | 9/1988 | European Pat. Off. |
| 0303109 | 2/1989 | European Pat. Off. |
| 0308578 | 3/1989 | European Pat. Off. |
| 0374931 | 6/1990 | European Pat. Off. |
| 1493822 | 9/1967 | France |
| 57-61553 | 4/1982 | Japan |
| 60-225101 | 11/1985 | Japan |
| 62-73202 | 4/1987 | Japan |
| 2057355 | 4/1981 | United Kingdom |

OTHER PUBLICATIONS

Patent Abstracts of Japan, JP-61-145823, Jul. 3, 1986, AN 59-267343, M. Mashita, et al., "Molecular Beam Epitaxial Growth Method".
Patent Abstracts of Japan, JP-61-144029, Jul. 1, 1986, AN 59-265792, T. Serikawa, "Method and Apparatus for Manufacturing Silicon Oxide Film Containing Phosphorus".
Patent Abstracts of Japan, JP-62-73202, Apr. 3, 1987, AN 60-213845, Y. Oi, "Production of Thin Optical Film".
Patent Abstracts of Japan, JP-55-110127, Aug. 25, 1980, AN 54-18238, M. Azuma et al., "Preparation of Plastic Antireflection Film".
Chemical Abstracts, vol. 97, No. 22, Feb. 1982, p. 300, No. 187013z, "Silica Coating on Glass Plates".
Chemical Abstracts, vol. 97, No. 22, Feb. 1982, p. 300, No. 187014a, "Silica Coating on Glass Plates".
Chemical Abstracts, vol. 97, No. 22, Feb. 1982, p. 300, No. 187015b, "Durable Silica Film Coating on Glass Plates".
Chemical Abstracts, vol. 92, 1980, p. 264, No. 219710q, T. Stefaniak, "Protecting Properties and Behavior of Antireflection Coatings".

Primary Examiner—Donald J. Loney
Attorney, Agent, or Firm—Oblon, Spivak, McClelland, Maier & Neustadt

[57] ABSTRACT

A laminated glass structure comprises two glass sheets, a plastic layer arranged at the bonding surface of one of the glass sheets, and a functioning layer consisting of single- or multi-layered films provided on the bonding surface of the glass sheet to the platic layer, wherein the functioning layer has a film having an energy gap of 4 electron volts or higher which is in contact with the plastic layer.

25 Claims, 2 Drawing Sheets

LAMINATED GLASS STRUCTURE

This application is a continuation of application Ser. No. 07/451,311, filed on Dec. 15, 1989, now abandoned, which is a continuation-in-part application of the application Ser. No. 07/318,330 having a filing date of Mar. 3, 1989 now U.S. Pat. No. 5,110,637.

BACKGROUND OF THE INVENTION

1. Field of the Invention

The present invention relates to a laminated glass structure, more particularly, relates to a laminated glass structure suppressing turbidity arising along with a lapse of time. Laminated glass assemblies have been widely used for windows and sun roofs for automobiles, windows for airplanes, ships and buildings and so on as so-called safety glass because pieces of glass do not scatter at the time of the breakage of a glass sheet and the penetration resistance is high. At present, the laminated glass assemblies have been widely used for a wind shield glass for automobiles from the viewpoint of assuring safety. There has been also proposed a type of laminated glass of which the bonding surface side is coated with a transparent conductive film so that the laminated glass has both defogging function and solar radiation reflecting function. As the transparent conductive film, a single-layered metal film such as an Au film or an Ag film, a single-layered metal oxide film such as an ITO film or a $SnO_2$ film or a multi-layered film wherein an Ag film is interposed between dielectric films of metal oxide such as ITO (Indium-Tin-Oxide), TiOx, SnOx, ZnOx have been used. Since the single-layered metal film and the single-layered metal oxide film have drawbacks in color tone, durability and electric resistance, the multi-layered film wherein the Ag film is interposed between the metal oxide films of dielectric substances such as ZnO has been widely used.

2. Discussion of Background

FIG. 3 shows an example of a conventional laminated glass structure in which a transparent conductive film is formed by a multi-layered film having an Ag film between dielectric films in order to give a defogging function and a solar radiation reflecting function.

The above-mentioned laminated glass has a plastic interlayer 13 made of polyvinyl butyral (PVB) at the bonding surface between a glass sheet 11 arranged at the exterior side of a vehicle and a glass sheet 12 arranged at the interior side, and an Ag film 16 is interposed between dielectric films 15, 17 such as ZnOx films as a dielectric substance which are arranged between the glass sheet 11 at the exterior side of the vehicle and the plastic interlayer 13, whereby a transparent conductive film 14 consisting of three-layered films is interposed between the glass sheet 11 and the plastic interlayer 13 so as to perform the both functions of defogging and solar radiation reflecting. The dielectric films 15, 17 are to increase visible light transmittance by an optical interference effect with the metal film 16.

As the plastic interlayer 13, PVB (polyvinyl butyral), EVA (ethylene-vinyl acetate copolymer), urethane or the like may be used. Especially, the PVB has been generally used as laminated glass assemblies for vehicles which require especially safety because it has excellent penetration resistance, and is chemically and optically stable for a long period of time. In this case, a PVB film containing a predetermined amount of moisture is used in order to provide excellent penetration resistance.

In the conventional laminated glass structure as shown in FIG. 3, it is possible to impart a defogging function by heating the transparent conductive film 14 arranged at the bonding surface by supplying an electric current. Further, since the transparent conductive film 14 possesses a solar radiation reflecting function itself, a cooling load of air-condition can be reduced, so that it effectively functions to save energy.

However, it was found that a phenomenon of turbidity has partially occurred upon expiration of a long period of time in a case that a laminated glass is formed by arranging the above-mentioned transparent conductive film 14 consisting of a multi-layered film including therein the Ag film 16 between the dielectric films 15, 17 made of a metal oxide.

SUMMARY OF THE INVENTION

The inventors of this application have found that the turbidity has occurred due to photo-chemical reduction of the layer contacting to the interlayer, and the present invention have been achieved on the basis of the above-mentioned finding. Namely, the phenomenon of turbidity is avoidable by using a layer having an energy gap of 4 e V (electron volts) or higher as a layer in contact with the interlayer.

According to the present invention, there is provided a laminated glass structure which comprises
 at least one glass sheet,
 a plastic layer arranged at the bonding surface of said glass sheet, and
 a functioning layer consisting of single- or multi-layered films provided on the bonding surface of at least one glass sheet to the platic layer, wherein the functioning layer has a film having an energy gap of 4 electron volts or higher which is in contact with the plastic layer.

BRIEF DESCRIPTION OF THE DRAWINGS

A more complete appreciation of the invention and many of the attendant advantages thereof will be readily obtained by reference to the following detailed description when considered in connection with the accompanying drawings, wherein.

DETAILED DESCRIPTION OF THE PREFERRED EMBODIMENTS

Figure 1:
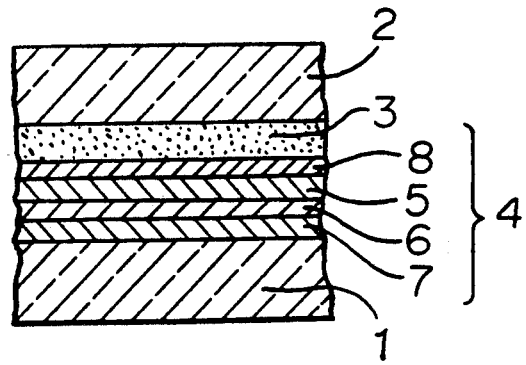
FIGS. 1 and 2 are respectively enlarged longitudinal cross-sectional view partly omitted of embodiments of the laminated glass structure according to the present invention.

Referring to the drawings, wherein the same reference numerals designate the same or corresponding parts, and more particularly to FIG. 1 thereof, there is shown an enlarged longitudinal cross-sectional view of an embodiment of the laminated glass structure in the present invention. In FIG. 1, a laminated glass has a plurality of, for instance, two glass sheets 1, 2, a plastic interlayer 3 arranged at the bonding surface of the glass sheets 1, 2, and a functioning layer 4 consisting of one or plural films arranged at the bonding surface of, for instance, the glass sheet 1 at the exterior side of a vehicle, wherein the functioning film 4 is comprising a film having an energy gap of 4 e V or higher as a layer 8 in contact with the plastic interlayer 3.

As the functioning layer 4 in the present invention, various films having various kinds of function can be utilized, such as an optical function wherein light of a predetermined range of wavelength is selectively reflected, interrupted or transmitted, an electric function such as electrical heating for melting snow and for defogging, electromagnetic shielding or as an antenna for receiving or radiating electromagnetic waves, a photo-voltaic function such a a solar cell, an electrically light control function such as light control by liquid crystal or an electrochromic material and so on.

FIG. 1 shows an example of the functioning layer 4 wherein a metal film 6 made of Ag or Au or the like is sandwiched between dielectric films 5, 7 such as ZnO, SnO$_2$ or the like to form a multi layered film, and a film 8 having an energy gap of 4 e V or higher is formed at the bonding surface of the multi-layered film to an interlayer 3. The functioning film 4 has a solar radiation reflecting function and an electric conductive function by the metal such as Ag, Au or the like. The electric films 5, 7 are to increase the visible transmittance of the functioning layer as a whole by an optical interference effect with the metal film 6.

The reason that the layer having an energy gap of 4 e V or higher is used in contact with the interlayer is as follows.

Figure 3:
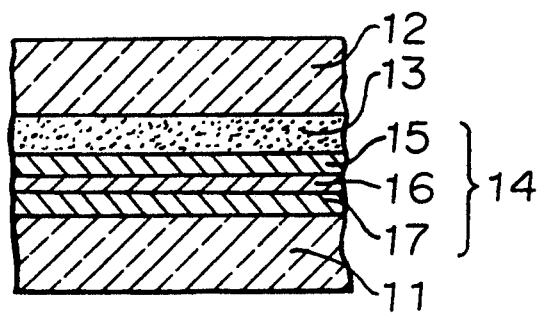
FIG. 3 is an enlarged longitudinal cross-sectional view partly omitted of a conventional laminated glass structure.

The inventors of this application have found that ZnO, TiO$_2$, SnO$_x$, ITO and so on, which were used as the dielectric layer 15 as shown in FIG. 3, have an energy gap (Eg) of less than 4 e V. The wave length range of solar radiation at the ground level is about 310 nm-2 $\mu$m, which corresponds to an amount of energy of about 4 e V-0.06 e V. It was confirmed that when a film having an energy gap (Eg) of less than 4 e V, for instance, a ZnO film (Eg = 2.47 e V) was in contact with the interlayer 3, it absorbed ultraviolet (UV) light having energy corresponding to the Eg and photo-induced reduction (Zn$^{2+}\rightarrow$Zn) took place in the presence of moisture contained in the interlayer.

Figure 4B:
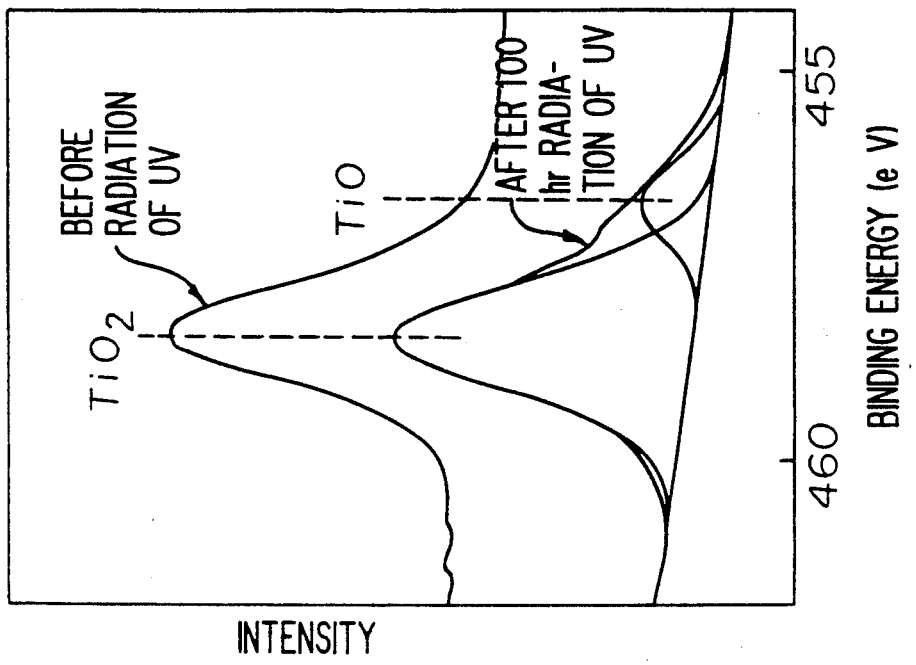
FIGS. 4a and 4b are respectively diagrams showing test results by ESCA on surface conditions of a ZnO film and a $TiO_2$ film which are respectively in contact with an interlayer before and after the irradiation of ultraviolet rays for 1,000 hours and 100 hours.
Figure 4A:
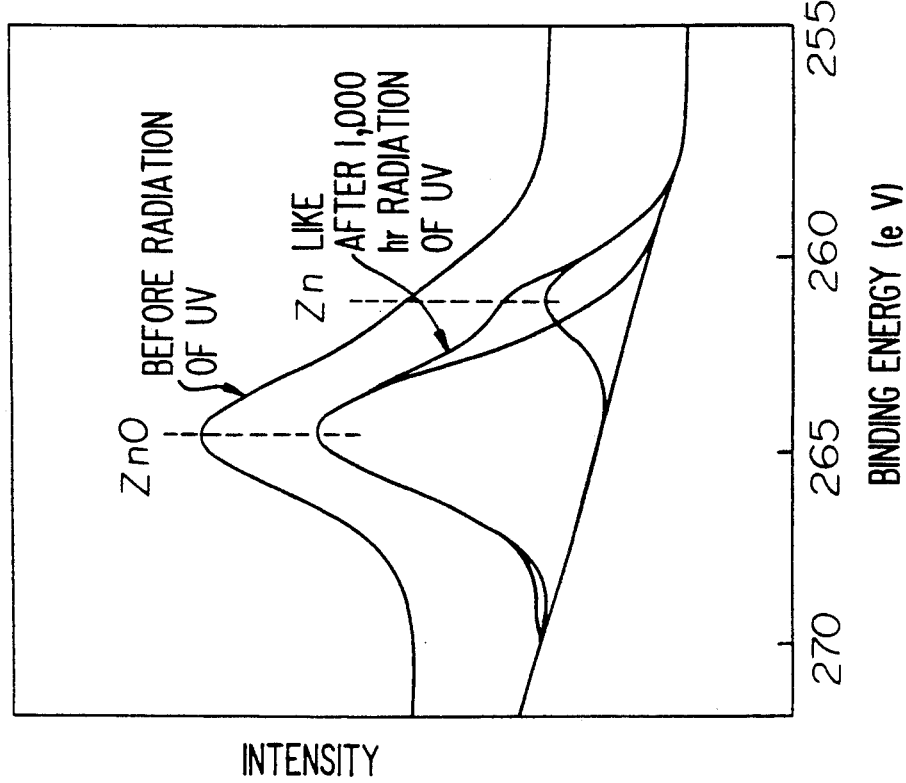

FIG. 4a shows a result of measurement by ESCA which shows the surface condition of the ZnO film to which the interlayer contacts, before and after the 1,000 hour irradiation of the ultraviolet light. It shows that there is a reduced product of ZnO after the irradiation of the UV.

FIG. 4b shows a result of measurement by the ESCA of a TiO$_2$ film (Eg = 3.27 e V) (which is conventionally used as a dielectric film instead of the ZnO film) which is in contact with the interlayer, before and after 100 hour irradiation of the UV light. It is found that there is a reduced product of TiO$_2$ in the same manner as in FIG. 4a.

It was also confirmed that a reduction took place on other type of dielectric film having the energy gap of less than 4 e V, for instance, CrO$_x$ (Eg<1), SnO$_2$, ITO or the like which was used as the dielectric film 15 as shown in FIG. 3.

The reduction seems to occur due to a photochemical reaction as follows.

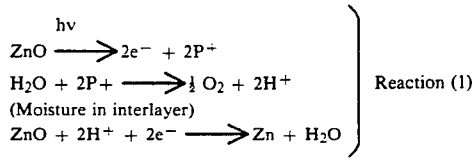

$$\left. \begin{array}{l} h\nu \\ ZnO \longrightarrow 2e^- + 2P^+ \\ H_2O + 2P+ \longrightarrow \tfrac{1}{2} O_2 + 2H^+ \\ \text{(Moisture in interlayer)} \\ ZnO + 2H^+ + 2e^- \longrightarrow Zn + H_2O \end{array} \right\} \text{Reaction (1)}$$

If there is a metal layer 16 such as Ag which is easily oxidized as shown, for instance, in FIG. 3, oxygen produced by the above-mentioned reaction (1) passes through the dielectric film 15 to reach the metal layer 16, and oxidizes the metal of the metal layer, hence turbidity occurs due to the light scattering by the oxidized metal. For instance, it is considered that Ag is oxidized to form silver oxide, which scatters light, hence turbidity occurs.

Accordingly, when a layer contacting to the interlayer has an energy gap of 4 e V or higher, no reaction occurs, hence the oxidation of the metal located at the opposite side does not take place.

The value of the energy gap in the present invention is obtained as follows. A film having a thickness of about 1 $\mu$m is formed on quartz glass, and the reflectance and the transmittance are measured to thereby obtain the wavelength dependency of an absorbing coefficient.

From the above-mentioned reason, it is necessary that the layer 8 contacting the interlayer has an energy gap of 4 e V or higher. As examples of such layer 8, there are layers comprising oxide containing at least one member selected from the group consisting of Zr, Ti, Hf, Sn, Ta and In and at least one member selected from the group consisting of B and Si, for example, an oxide containing zirconium and silicon ZrSi$_x$O$_y$ (when x=2, Eg=5.6 e V), oxide containing zirconium and boron ZrB$_x$O$_y$ (when x=2, Eg=5.2 e V), SiO$_x$ (Eg=8 e V), oxide containing zirconium, boron, silicon ZrB$_x$Si$_y$O$_z$, or a film made of a material of Ta$_2$O$_5$ (Eg=4.2 e V), NiO (Eg=4.2 e V), Ga$_2$O$_3$ (Eg=4.6 e V), Sb$_2$O$_3$ (Eg=4.1 e V), MgF$_2$ (Eg=5.9 e V), LiF (Eg=11.3 e V), CaF$_2$ (Eg=8.3 e V), LaF$_3$ (Eg=5.6 e V), CeF$_3$ (Eg=4.1 e V) or the like, and a film composed essentially of SiO$_2$ and having additives of Ti, Ta, Hf, Mo, W, Nb, Sn, La, Cr or the like added thereto.

In SiO$_x$ films, the value x is not particularly limited. However, when x is about 2, a dense amorphous film can be obtained and it exhibits a good barrier performance to moisture and oxygen from the interlayer. Accordingly, the SiO$_x$ films wherein x is about 2 is preferably used in particular. When a SiO$_x$ film is formed from a Si target or a SiO$_2$ target, it is necessary to use a RF sputtering method because such targets have no substantial electric conductivity. However, such RF sputtering method is slow in a film-forming speed and productivity is not good. Further, RF sputtering is not suitable for forming a uniform film for a large surface area.

On the other hand, films composed essentially of an oxide containing at least one member selected from the group consisting of Zr, Ti, Hf, Sn, Ta and In and at least one member selected from the group consisting of B and Si, for example, films comprising ZrSi$_x$O$_y$, ZrB$_x$O$_y$, or ZrSi$_x$B$_y$O$_z$ are advantageous in that these films are amorphous, whereby the grain boundaries disappear and the superior barrier effect to block moisture and oxygen from the interlayer can be obtained, and also advantageous in that a DC sputtering method can be adopted.

The composition of ZrBxOy films is not limited in particular so long as the films have an energy gap of 4 eV or higher. However, there is a tendency that the resistance to humidity decreases when the atomic ratio x of boron to zirconium is larger than 3, i.e. $x>3$. On the other hand, when $x \geq 0.05$, the films are amorphous, whereby the grain boundaries disappear. Accordingly, in consideration of a further improvement of function of the barrier (to block moisture and oxygen from the interlayer), it is preferable to determine $0.05 \leq x \leq 3$. On the other hand, when the atomic ratio y of oxygen to zirconium is too large, the film structure becomes coarce, i.e. a porous film is produced. When the atomic ratio is too small, the film becomes metallic and the transmittance is decreased. Accordingly, it is preferable to determine a range of $2 \leq y \leq 6.5$.

Similarly, the composition of ZrSixOy films is not in particular limited so long as the films have an energy gap of 4 eV or higher. In this case, when the atomic ratio x of silicon to zirconium is in a range of $x \geq 0.05$, the films are amorphous, whereby the grain boundaries disappear, denseness is increased, namely, there is obtainable a further improvement of a barrier function. In consideration that when $x \leq 19$, stability of glow discharge in use of the DC sputtering method can be obtained, it is preferable to determine a range of $0.05 \leq x \leq 19$.

The atomic ratio y of oxygen to zirconium is preferably in a range of $2.1 \leq y \leq 40$ by the same reason as the ZrBxOy films.

The composition of ZrBxSiyOz films is not limited in particular in the same as mentioned above so long as the film have an energy gap of 4 eV or higher. However, it is preferable that the atomic ratios x, y and z of boron, silicon and oxygen to zirconium are respectively in a range of $0.05 \leq x+y \leq 19$ (wherein $x+y-3>0$ and $x-3y+1>0$ are excluded). It is because when $0.05 \leq x+y$, the film is amorphous so that the grain boundaries disappear and the denseness is improved, hence a barrier effect can be further improved, and when $x+y \leq 19$, stable film forming can be attained by a DC sputtering method. When the film is considered as a composite system of $ZrO_2$, $B_2O_3$ and $SiO_2$, $B_2O_3$ is relatively poor in durability to chemicals. Accordingly, it is not preferable to employ a composition containing an amount of $B_2O_3$ such that $ZrO_2<25$ mol % and $SiO_2<25$ mol %, balanced by $B_2O_3$ in the film (namely, when Zr:B:Si (atomic ratio) in a ZrBxSiyOz film is 1:x:y, $1/(1+x+y)<0.25$ and $y/(1+x+y)<0.25$, in other words, $x+y-3>0$ and $x-3y+1>0$) because the durability to chemicals is inferior. The atomic ratio z of oxygen to zirconium is preferably in a range of $2<z<40$ for the same reason as the ZrBxOy film.

It is also preferable to employ the film composed essentially of $SiO_2$ and having Ti, Ta, Hf, Mo, W, Nb, Sn, La, Cr or the like added thereto as the layer with the energy gap of 4 eV or higher, because such film is amorphous and can be formed by a DC sputtering method. An amount of the additive element is not limited in particular so long as the film has an energy gap of 4 eV or higher. However, it is more preferable that the amount of the additive elements contained in the film is at least 4 atomic % to the total amount of Si and the additives because stable DC sputtering can be conducted by using such an alloy target.

It is also preferable to use the tantalum oxide ($Ta_2O_5$) film which is also amorphous and constitutes a dense film, whereby it exhibits a barrier to moisture and oxygen from the interlayer. The $Ta_2O_5$ film can be formed by a DC sputtering method, however it is more or less difficult to get stable discharge with high deposition rate by DC sputtering. Accordingly, the $Ta_2O_5$ film is disadvantageous with this suspect.

NiO film is also preferable for the layer ($Eg \geq 4$ eV), and can be formed by DC sputtering, using Ni target. However, as Ni is a magnetic material, magnetron DC sputtering, which is the most popular sputtering method with a high film-forming rate, cannot be employed, and is disadvantageous in productivity.

Other materials for the layer ($Eg \geq 4$ eV), such as $Ga_2O_3$, $Sb_2O_3$, $MgF_2$, LiF, $CaF_2$, $LaF_3$, $CeF_3$, are expensive and are preferable to be formed by vacuum vapor deposition.

Other components may be added to the layer 8 contacting to the interlayer in order to adjust an optical properties, to obtain stability at the time of forming a film, to improve the film-forming speed and so on. A desired refractive index can be imparted to a film made of ZrBxOy, ZrSiOy or ZrBxSiyOz by controlling the film composition because the refractive index of film is reduced from 2.1 to 1.5 as the amount of B or Si to ZrOx is increased. Similary, a desired refractive index can be obtained by using a film made essentially of $SiO_2$ and having additives Ti, Ta, Hf or the like added thereto and by controlling the amount of the additives.

It is preferable that the layer 8 with $Eg \geq 4$ eV contacting the interlayer has a thickness of 10 Å or higher. When it is thinner than this, an island-like film is formed and a uniform film can not be formed. Thus, there is produced a portion where no film 8 is formed.

As the functioning film of the present invention, there are following functioning layers, for instance, although the layers are not limited herein.

As an example of the functioning layer having a transparent film including a metal layer, FIG. 1 shows a functioning layer having the construction of (glass/) dielectric film 7/metal 6/dielectric film 5/film 8 ($Eg \geq 4$ eV)(/interlayer). Ag, Au, Pd, Cu, Pt or the like or an alloy of these elements, e.g. an Ag-Pd alloy may be used for the metal 6. As the dielectric films 5, 7, ZnO, $TiO_2$, $SnO_2$, Al doped ZnO or $SnO_2$ in which F or Sb is doped, or ITO (tin-doped indium oxide) may be used. In the functioning layer having the above-mentioned construction, since the metal layer is a transparent conductive layer which is transparent and has electric conductivity, it can be used as an electrically heated glass or windshield by attaching an electric heating means such as a bus bar or the like which is formed by printing a conductive material, for example. Since the metal layer has solar radiation shielding property as well as transparency, it can be used as a heat radiation shielding glass in a case when no electric heating means is attached thereto. As described before, the dielectric films sandwiching the metal layer 6 is to improve the visible transmittance by utilizing the optical interference.

Figure 2:
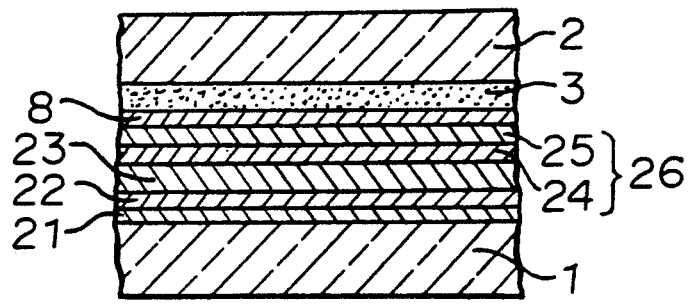

FIG. 2 is a longitudinal cross-sectional view showing another embodiment of a laminated glass structure according to the present invention wherein a solar cell thin film is used for a functioning layer. Namely, an alkali barrier film 21 composed of $SiO_2$, $Al_2O_3$ or the like, a first transparent electrode 22 composed of $SnO_2$, ITO or the like, an photo-voltaic film 23 such as amorphous silicon film, and a rear side electrode (a transparent conductive film) 26 are sequentially formed in this order on a glass sheet 1 at the exterior side of a vehicle wherein the film 8 of Eg≧4 e V is interposed therein when the glass sheet 1 and a glass sheet 2 at the interior side are laminated with a plastic interlayer 3 therebetween. Thus, a functioning layer 4 comprises the multilayered films 21-26 and 8.

The transparent conductive film 26 as the rear side electrode may be composed of two or three or more layers such as a metal film 24 and other film 25, or may be composed solely of one layer of the metal film 24, or may be composed solely of one layer of transparent conductive material such as ITO, F or Sb doped $SnO_2$, and so on.

The metal film 24 may be a layer made of Ag, Au, Pd or Al or an alloy film made of at least two different kinds of these materials. Further, said other film 25 may be a dielectric film such as ZnO, ZnS, $TiO_2$, ITO, $SnO_2$ or the like, or a film composed of a semiconductor material such as Si or the like.

Further, the functioning layer 4 may have such construction of (glass/) dielectric film/metal/dielectric film (Eg≧4 e V) (/interlayer) wherein the dielectric film 5 as shown in FIG. 1 is formed by a layer having Eg≧4 e V. For instance, it may have the construction of (glass/) $ZrSi_xO_y$/Ag/$ZrSi_xO_y$ (/interlayer). It is not always necessary to use the film having Eg≧4 e V for the dielectric film contacting the glass sheet.

Further, as another example of the construction of the functioning layer 4, there are proposed such construction of (glass/) absorbing film/film 8 (Eg≧4 e V) (/interlayer), or (glass/) dielectric film/absorbing film/dielectric film/layer 8 (Eg≧4 e V) (/interlayer) in order to utilize the solar radiation shielding function of the absorbing film. As the absorbing film, a film composed of a nitride, a boride, a carbide or a mixture thereof may be used. The dielectric film is to increase the visible transmittance by optical interference, which may be the same dielectric film as described with reference to FIG. 1. As concrete examples, there are (glass/) TiN/$ZrB_xO_y$ (/interlayer) or (glass/) $TiO_2$/TiN/$TiO_2$/$ZrB_xO_y$ (/interlayer). The absorbing film may increase the visible transmittance by oxidization (for instance, TiN is partially changed to $TiO_2$). However, in accordance with the present invention, the oxidization of such absorbing film can be avoided.

As another example of the functioning film 4 wherein a transparent conductive film without any metal layer is used, there are (glass/) transparent conductive film/film 8 (Eg≧4) (/interlayer) or (glass/) alkali barrier film/transparent conductive film/film 8 (Eg≧4 e V) (/interlayer). As the transparent conductive film, there are ITO (tin-doped indium oxide), F- or Sb-doped $SnO_2$ or Al doped ZnO. As the alkali barrier film, there are $SiO_2$ or $Al_2O_3$. The alkali barrier film is to prevent the diffusion of alkali ions from glass into the transparent conductive film to thereby increase the resistance of the conductive film. A laminated glass in which such transparent conductive film is formed can be used as electromagnetic shielding glass or a glass antenna.

In the laminated glass structure having the above-mentioned films, another kind of film can be interposed between adjacent films or between a film and a glass sheet in order to improve bonding property and to adjust optical properties.

As a film-forming method for the functioning film 4, a spraying method, a vacuum vapor deposition method, a DC sputtering method, or a chemical vapor deposition method may be used. However, in view of the productivity and the film thickness uniformity for large area coating, it is preferred to form films by the DC sputtering method.

In preparing a laminated glass having such functioning film and having a curved surface, glass sheets may be shaped to have a desired form before the films are formed on either of the glass sheets, or the films may be previously formed on a glass sheet and then, the glass sheets may be shaped to have a desired form.

In the present invention, sodalime silicate glass sheets, aluminosilicate glass sheets, borosilicate glass sheets, lithium aluminosilicate glass sheets or the like may be used for the glass sheets 1, 2 although the present invention is not limited thereto. It is especially preferable to use the sodalimesilicate glass sheets because they are available at a low cost. Further, a solar absorbing glass sheet having Ni, Cr, Co, Fe, Se or the like as additives may be used.

As the plastic interlayer 3 used for bonding the glass sheets 1, 2, PVB (polyvinyl butyral), EVA (ethylene-vinyl acetate copolymer), urethane or the like may be used. However, when a laminated glass for a vehicle is to be prepared, it is preferred to use PVB having excellent resistance to penetration and durability.

Description has been made as to laminated glass structures wherein two glass sheets are used. However, the present invention may also be applied to a laminated glass structure wherein three or more glass sheets are used. In a case that such a laminated glass structure is used for a vehicle, it is preferable that the functioning layer 4 is formed at the bonding surface of the glass sheet located at the outermost side.

Since the film 8 having Eg≧4 e V is formed on the contacting surface to the interlayer 3 in the laminated glass having the above-mentioned construction of the present invention, turbidity can be effectively suppressed in such a case that a material which causes the turbidity through oxidation is contained in the functioning layer.

In a case that the functioning layer includes a material which invites increase of visible transmittance by oxidation, such as an absorbing film, such increase of transmittance can be prevented according to the present invention.

As an advantage other than the above mentioned advantages of the present invention, it was found that the bonding strength between the functioning layer 4 and the interlayer 3 did not change for a long period of time because the laminated glass structure of the present invention has such construction that the layer 8 having Eg≧4 e V is in contact with the interlayer. The reason seems to be as follows. Let's take ZnO having Eg<4 e V as an example. Hydrogen atoms at the surface of the interlayer and oxygen atoms in ZnO are bonded in a relation of Zn—O . . . H—O (interlayer) with a hydrogen bonding strength between ZnO and the interlayer such as a PVB film. However, when the Zn—O bond is broken by the reduction of ZnO due to moisture and ultraviolet radiation as in the above-mentioned reaction, there is a possibility that the above-mentioned hydrogen bond does not contribute to the bonding strength to the interlayer.

Let's take another example of ITO (tin-doped indium oxide). In this case, it is considered that a hydrogen bond is formed in a relation of In—O . . . H—O (interlayer), which is broken when indium is reduced and In—O bond is separated, whereby the hydrogen bond does not contribute to the bonding strength.

The above-mentioned explanation can be applied to a case of using $SnO_2$ or other materials with $Eg<4$ eV. In the present invention, however, since a film having an energy gap of $Eg \geq 4$ eV is used as the layer contacting with the interlayer, such film is not reduced by the ultraviolet light and does not cause any change. Accordingly, it is considered that the bonding strength can be maintained for a long period of time.

The laminated structure of the present invention can be applied to a bi-layer type laminated structure of a glass sheet and a plastic layer, namely, glass/functioning layer/plastic layer, wherein the functioning layer has a film ($Eg \geq 4$ eV) in contact with the plastic layer. The plastic layer may be a single-layered plastic film made of the same material as mentioned for above interlayer, or may be a multi-layered plastic film, for example, (glass/functioning layer/) energy absorbing layer/self-healing layer. Said energy absorbing layer and self-healing layer may be made of various kinds of urethane, for example. Said energy absorbing layer is employed to absorb the shock in case of an accident, and it is preferable to contain certain amount of moisture in order to provide good penetration resistance. Said self-healing layer may be replaced by a plastic film, such as a polyethylene terephthalate film, or a nylon film.

Now, the present invention will be described in detail with reference to Examples and Comparative Examples.

EXAMPLES

Various types of functioning layer were formed on glass sheets by a sputtering method, laminated glass structures were prepared by bonding other glass sheets with PVB films therebetween. Thus, prepared laminated glass structures were subjected to radiation of ultraviolet light for 100 hours. Table 1 shows film structures of the functioning layers of the laminated glass and the appearance after the radiation.

TABLE 1

| Sample No. | Film structure (Numerical values in Table show film thickness Å) | | Eg (eV)* | Appearance after UV radiation for 100 hrs. |
|---|---|---|---|---|
| Example | | | | |
| 1 | PVB/ZrBxOy/ZnO/Ag/ZnO/Glass<br>50  450 100 450 | x = 2<br>y = 5 | 5.24 | No change |
| 2 | PVB/ZrSixOy/ZnO/Ag/ZnO/Glass<br>20  450 100 450 | x = 2<br>y = 6 | 5.59 | ↑ |
| 3 | PVB/ZrBxSiyOz/ZnO/Ag/ZnO/Glass<br>45    450 100 450 | x = 1<br>y = 1<br>z = 5.5 | 5.30 | ↑ |
| 4 | PVB/Ta2O5/ZnO/Ag/ZnO/Glass<br>20   450 100 450 | | 4.2 | ↑ |
| 5 | PVB/SiO2/ZnO/Ag/ZnO/Glass<br>20  450 100 450 | | 8 | ↑ |
| 6 | PVB/SiO2:Ti/ZnO/Ag/a-Si/SnO2/SiO2/Glass<br>50    400  200 4000 6000  800 | | 7 | ↑ |
| 7 | PVB/ZrBxOy/Ag/a-Si/SnO2/SiO2/Glass<br>400    200 4000 6000  800 | x = 2<br>y = 5 | 5.24 | ↑ |
| 8 | PVB/ZrSixOy/TiN/Glass<br>50    20 | x = 2<br>y = 6 | 5.59 | ↑ |
| 9 | PVB/ZrBxOy/CrNx/Glass<br>50    20 | x = 2<br>y = 5 | 5.24 | ↑ |
| 10 | PVB/ZrBxSiyOz/TiO2/TiN/TiO2/Glass<br>20      400  80  400 | x = 1<br>y = 1<br>z = 5.5 | 5.30 | ↑ |
| Comparative Example | | | | |
| 11 | PVB/ZnO/Ag/a-Si/SnO2/SiO2/Glass<br>400  200 4000 6000  800 | | 2.47 | Turbid |
| 12 | PVB/SnO2/Ag/SnO2/Glass<br>450  100 450 | | 3.33 | ↑ |
| 13 | PVB/TiO2/ZnO/Ag/ZnO/Glass<br>20  450 100 450 | | 3.27 | ↑ |
| 14 | PVB/CrOx/ZnO/Ag/ZnO/Glass<br>20   450 100 450 | | <1 | ↑ |

A mark * in Table 1 indicates energy gap (Eg) of the layer contacting with PVB.

As is clear from Table 1, no change of the appearance was found in the case that the energy gap Eg of the layer contacting with the interlayer is 4 eV or higher. On the other hand, turbidity was found in the case that the layer having an energy gap in a relation of $Eg<4$ eV is in contact with the interlayer.

Further, in Examples 1-10 (sample numbers 1-10), there was no substantial change in the initial bonding strength even after ultraviolet light was irradiated for 1,000 hours. On the other hand, a slight change was found in bonding strength in Comparative Examples 11-14 (sample numbers 11-14) after 1,000 hours radiation of ultraviolet light.

As described above, in the laminated glass structure of the present invention in which a functioning layer is formed between an interlayer and a glass sheet, a film having $Eg=4$ eV is used for the layer contacting with the interlayer. Accordingly, such film can not be reduced by ultraviolet light and moisture contained in the interlayer. Further, turbidity and an increase in transmittance can be avoided even in a case that the functioning layer includes metal which causes turbidity due to oxidation and an absorbing film which causes an increase of transmittance. Accordingly, a stable laminated glass structure without any change in appearance for a long period of time can be provided.

Further, in the laminated glass structure of the present invention, there is no change of a bonding strength for a long period of time and it has a high reliability.

The laminated glass structure of the present invention realizes a laminated glass having a functioning layer having various function and reliable for a long period of time. Further, it can be preferably used not only for buildings but also for vehicles to which higher reliability is required.

Obviously, numerous modifications and variations of the present invention are possible in light of the above teachings. It is therefore to be understood that within the scope of the appended claims, the invention may be practiced otherwise than as specifically described herein.

What is claimed is:

1. A laminated glass structure, comprising:
   (I) at least one glass sheet,
   (II) a functioning layer comprising:
      (1) a first dielectric film layered on the glass sheet;
      (2) a metal film layered on the first dielectric film;
      (3) a second dielectric film layered on the metal film, said first dielectric film and second dielectric film having an energy gap of <4 eV and being selected from the group consisting of ZnO, $TiO_2$, $SnO_x$, ITO, $CrO_x$, ZnO doped with Al, $SnO_2$ doped with F, $SnO_2$ doped with Sb, Si and ZnS; and
      (4) a film having an energy gap of 4 electron volts or higher thereon, said film having an energy gap of 4 electron volts or higher being selected from the group consisting of:
         (i) one member selected from the group consisting of $Ta_2O_5$, NiO, $Ga_2O_3$, $MgF_2$, LiF, $CaF_2$, $LaF_3$ and $CeF_3$;
         (ii) $SiO_2$ having at least one additive selected from the group consisting of Ti, Ta, Hf, Mo, W, Nb, Sn, La and Cr; and
         (iii) an oxide containing at least one first member selected from the group consisting of Zr, Hf, Sn, Ta and In and at least one member selected from the group consisting of B and Si; and
   (III) a plastic layer on said film having an energy gap of 4 electron volts or higher.

2. The laminated glass structure according to claim 1, wherein the first and second dielectric films are ZnO and the metal layer is Ag.

3. The laminated glass structure according to claim 1, wherein the first and second dielectric films are $SnO_2$ and the metal layer is Ag.

4. The laminated glass structure according to claim 1, wherein the functioning layer further comprises a transparent conductive non-metal film.

5. The laminated glass structure according to claim 1, 2, 3, or 4, wherein the film having an energy gap of 4 electron volts or higher is amorphous.

6. The laminated glass structure according to claim 1, wherein the film having an energy gap of 4 electron volts or higher is essentially composed of one member selected from the group consisting of, $Ta_2O_5$, NiO, $Ga_2O_3$, $Sb_2O_3$, $MgF_2$, LiF, $CaF_2$, $LaF_3$ and $CeF_3$, wherein x in said $SiO_x$ is about 2.

7. The laminated glass structure according to claim 1, wherein the film having an energy gap of 4 electron volts or higher is essentially composed of $SiO_2$ having at least one additive selected from the group consisting of Ti, Ta, Hf, Mo, W, Nb, Sn, La and Cr.

8. The laminated glass structure according to claim 1, wherein the film having an energy gap or 4 electron volts or higher is essentially composed of an oxide containing at least one first member selected from the group consisting of Zr, Ti, Hf, Sn, Ta and In, and at least one second member selected from the group consisting of B and Si.

9. The laminated glass structure according to claim 8, wherein the film having an energy gap or 4 electron volts or higher is essentially composed of an oxide containing Zr and B($ZrB_xO_y$), wherein the atomic ratio x of B to Zr is $0.5 \leq x \leq 3$, and the atomic ratio y of O to Zr is $2 \leq y \leq 6.5$.

10. The laminated glass structure according to claim 8, wherein the film having an energy gap or 4 electron volts or higher is essentially composed of an oxide containing Zr and Si($ZrSi_xO_y$), wherein the atomic ratio x of Si to Zr is $0.05 \leq x \leq 19$, and the atomic ratio y of O to Zr is $2.1 \leq x \leq 40$.

11. The laminated glass structure according to claim 8, wherein the film having an energy gap or 4 electron volts or higher is essentially composed of an oxide containing Zr, B and Si($ZrB_xSi_yO_z$), wherein the atomic ratio x of B to Zr, the atomic ratio y of Si to Zr, and the atomic ratio y of O to Zr are $0.05 \leq x+y \leq 19$ and $2 < z < 40$, such that $x+y-3 \geq 0$ when $x-3y+1 > 0$.

12. The laminated glass structure according to claim 1, wherein the film having an energy gap or 4 electron volts or higher has a thickness of 10 Å or more.

13. The laminated glass structure according to claim 1, wherein the plastic layer comprises polyvinyl butyral.

14. The laminated glass structure of claim 1, wherein said $SnO_x$ of said first dielectric film and second dielectric film is $SnO_2$.

15. A laminated glass structure, comprising:
   (I) a glass sheet;
   (II) a solar radiation shielding layer thereon;
   (III) a film having an energy gap of 4 electron volts or higher layered thereon, said film having an energy gap of 4 electron volts or higher being selected from the group consisting of:
      (i) one member selected from the group consisting of $SiO_2$, $Ta_2O_5$, NiO, $Ga_2O_3$, $Sb_2O_3$, $MgF_2$, LiF, $CaF_2$, $LaF_3$ and $CeF_3$;
      (ii) $SiO_2$ having at least one additive selected from the group consisting of Ti, Ta, Hf, Mo, W, Nb, Sn, La and Cr; and
      (iii) an oxide containing at least one first member selected from the group consisting of Zr, Hf, Sn, Ta and In and at least one member selected from the group consisting of B and Si; and
   (IV) and a plastic layer on the film having an energy gap of 4 electron volts or higher.

16. The laminated glass structure according to claim 15, wherein the solar radiation shielding layer is composed essentially of at least one member selected from the group consisting of nitride, boride and carbide.

17. The laminated glass structure according to claim 15, further comprising a first dielectric film between the solar radiation shielding layer and the film having an energy gap of 4 electron volts or higher, and a second dielectric film between the solar radiation shielding layer and the glass sheet, said first dielectric film and second dielectric film having an energy gap of <4 eV and being selected from the group consisting of ZnO, $TiO_2$, tin oxide, ITO, chromium oxide, ZnO doped with Al, $SnO_2$ doped with F, $SnO_2$ doped with Sb, Si and ZnS.

18. A laminated glass structure, comprising:
    (I) a glass sheet,
    (II) a solar cell film layered thereon, comprising:
        (i) a transparent electrode,
        (ii) a photovoltaic film layered on the transparent electrode, and
        (iii) a rear side electrode layered on the photovoltaic film;
    (III) a film having an energy gap of 4 electron volts or higher selected from the group consisting of:
        (i) one member selected from the group consisting of $Ta_2O_5$, NiO, $Ga_2O_3$, $Sb_2O_3$, $MgF_2$, LiF, $CaF_2$, $LaF_3$ and $CeF_3$;
        (ii) $SiO_2$ having at least one additive selected from the group consisting of Ti, Ta, Hf, Mo, W, Nb, Sn, La and Cr; and
        (iii) an oxide containing at least one first member selected from the group consisting of Zr, Hf, Sn, Ta and In and at least one member selected from the group consisting of B and Si; and
    (IV) a plastic layer thereon.

19. The laminated glass structure of claim 18, wherein said transparent electrode is selected from the group consisting of $SnO_2$ or ITO.

20. The laminated glass structure of claim 18, wherein said photovoltaic film is amorphous silicon.

21. The laminated glass structure of claim 18, wherein said rear side electrode is a metal film.

22. The laminated glass structure of claim 21, wherein said metal is selected from the group consisting of Ag, Au, Pd, Al and alloys thereof.

23. The laminated glass structure of claim 21 or 22, further comprising a dielectric film layered on said metal film, said dielectric film being composed of a material selected from the group consisting of ZnO, ZnS, $TiO_2$, ITO, $SnO_2$ and Si.

24. The laminated glass structure of claim 18, wherein said rear side electrode is a transparent conductive material selected from the group consisting of ITO, $SnO_2$ doped with F and $SnO_2$ doped with Sb.

25. A laminated glass structure, comprising:
    (I) at least one glass sheet,
    (II) a functioning layer, selected from the group consisting of:
        (1) a layer comprising:
            (i) first dielectric film layered on the glass sheet;
            (ii) a metal film layered on the first dielectric film; and
            (iii) a second dielectric film layered on the metal film, said first dielectric film and second dielectric film having an energy gap of <4 eV and being selected from the group consisting of ZnO, $TiO_2$, $SnO_x$, ITO, $CrO_x$, ZnO doped with Al, $SnO_2$ doped with F, $SnO_2$ doped with Sb, Si and ZnS;
        (2) a solar radiation shielding layer thereon, selected from the group consisting of nitride, boride and carbide; and
        (3) a solar cell film layered thereon, comprising:
            (i) a transparent electrode,
            (ii) a photovoltaic film layered on the transparent electrode, and
            (iii) a rear side electrode layered on the photovoltaic film;
    (III) a film having an energy gap of 4 electron volts or higher comprising SiOx, wherein x in said SiOx is about 2; and
    (IV) a plastic layer on said film having an energy gap of 4 electron volts or higher.

* * * * *

UNITED STATES PATENT AND TRADEMARK OFFICE
CERTIFICATE OF CORRECTION

PATENT NO.  : 5,264,286
DATED       : November 23, 1993
INVENTOR(S) : Eiichi Ando et al.

It is certified that error appears in the above-indentified patent and that said Letters Patent is hereby corrected as shown below:

On the title page, Item [30],

The Foreign Application Priority Data, should read:

--Mar.  3, 1988   [JP]   Japan.............63-48765
  Mar. 31, 1988   [JP]   Japan.............63-76202
  Jun. 14, 1988   [JP]   Japan.............63-144827
  Oct. 21, 1988   [JP]   Japan.............63-264163
  Dec. 21, 1988   [JP]   Japan.............63-322736
  Jun. 29, 1989   [JP]   Japan.............1-165414
  Aug.  1, 1989   [JP]   Japan.............1-197993--

Signed and Sealed this

Twenty-sixth Day of July, 1994

Attest:

BRUCE LEHMAN

*Attesting Officer*      *Commissioner of Patents and Trademarks*